(12) United States Patent
Matsumori

(10) Patent No.: US 7,301,205 B2
(45) Date of Patent: Nov. 27, 2007

(54) SEMICONDUCTOR DEVICE AND METHOD OF MANUFACTURING THE SAME

(75) Inventor: Hisakazu Matsumori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 152 days.

(21) Appl. No.: 11/153,367

(22) Filed: Jun. 16, 2005

(65) Prior Publication Data

US 2006/0014340 A1    Jan. 19, 2006

(30) Foreign Application Priority Data

Jun. 16, 2004    (JP)    ............................. 2004-178473

(51) Int. Cl.
*H01L 27/01*    (2006.01)
(52) U.S. Cl. .................................... 257/347
(58) Field of Classification Search ................. 257/69, 257/347, 348, 349, 350, 351, 353, 354, E21.564, 257/E21.551; 438/149, 164, 199, 248, 391, 438/424, 435
See application file for complete search history.

(56) References Cited

U.S. PATENT DOCUMENTS

| | | | |
|---|---|---|---|
| 6,717,216 B1 | 12/2002 | Smith et al. | |
| 6,838,327 B2* | 1/2005 | Sakamoto et al. | ........... 438/199 |
| 6,882,025 B2* | 4/2005 | Yeo et al. | ................... 257/510 |
| 7,091,561 B2* | 8/2006 | Matsushita et al. | ......... 257/347 |
| 2004/0192009 A1* | 9/2004 | Belyansky et al. | ......... 438/424 |
| 2005/0074946 A1* | 4/2005 | Chu et al. | ................... 438/424 |
| 2005/0156274 A1* | 7/2005 | Yeo et al. | ................... 257/510 |
| 2005/0199945 A1* | 9/2005 | Kodama et al. | ............ 257/324 |

FOREIGN PATENT DOCUMENTS

| | | |
|---|---|---|
| JP | 2003-060076 | 2/2003 |
| JP | 2003-179157 | 6/2003 |
| JP | 3441259 | 6/2003 |
| JP | 2004-063591 | 2/2004 |

OTHER PUBLICATIONS

Shimizu, A et al., "Local Mechanical-Stress Control (LMC): A New Technique for CMOS-Performance Enhancement," IEEE Electron Devices Meeting, 2001, IEDM Technical Digest, International, Dec. 2-4, 2001, pp. 19.4.1-19.4.4.*

* cited by examiner

*Primary Examiner*—Zandra V. Smith
*Assistant Examiner*—Paul E Patton
(74) *Attorney, Agent, or Firm*—Finnegan, Henderson, Farabow, Garrett & Dunner, L.L.P.

(57) ABSTRACT

According to an aspect of the invention, there is provided a semiconductor device provided with a CMOS-FET circuit, comprising at least one of a tensile stress film disposed in a part of an element isolating film around an NMOS forming region and having a tensile stress, and a compressive stress film disposed in a part of an element isolating film around a PMOS forming region and having a compressive stress.

20 Claims, 20 Drawing Sheets

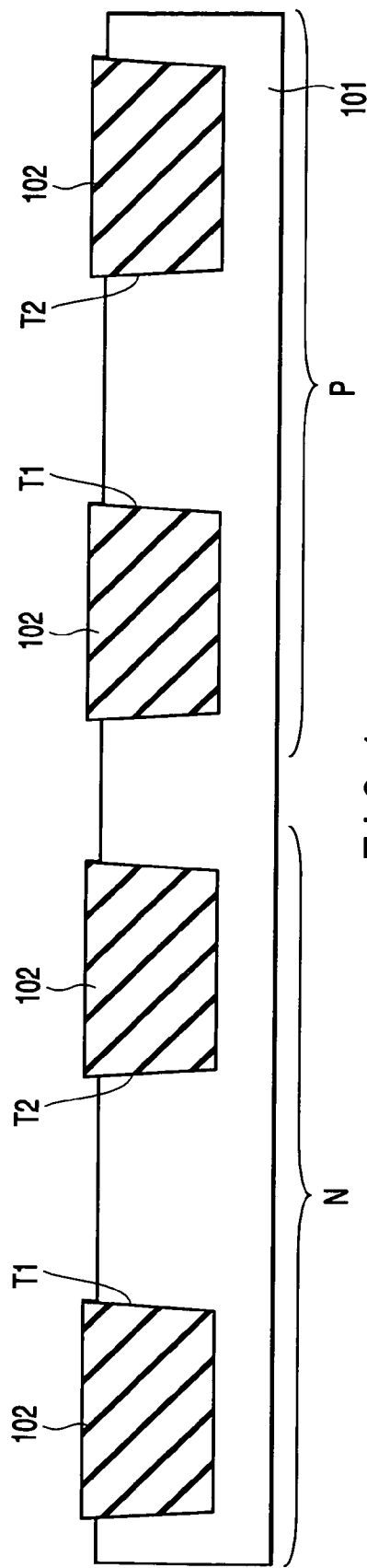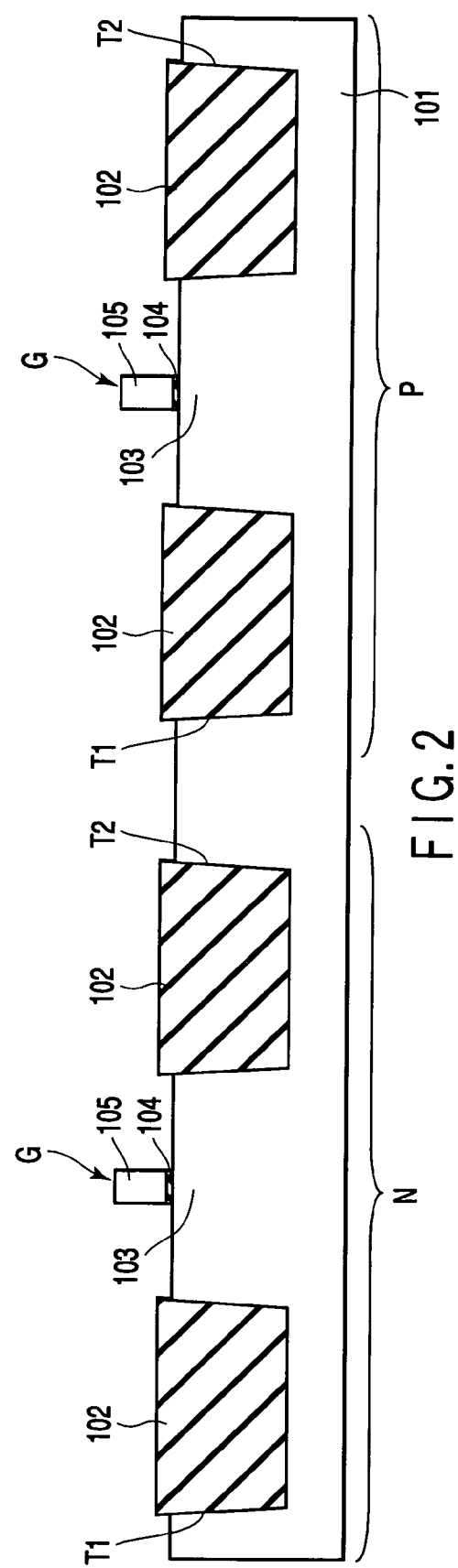

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-178473, filed Jun. 16, 2004, the entire contents of which are incorporated herein by reference.

BACKGROUND OF THE INVENTION

1. Field of the Invention

The present invention relates to a semiconductor device in which an active element such as a CMOS-FET is mounted on a semiconductor substrate, and a method of manufacturing the device.

2. Description of the Related Art

In this type of semiconductor device, it is supposed that a gate wire width is reduced in a channel length direction (L direction) to narrow a gap between channels in order to enhance a driving force of a MOS-FET using a conventional technique. However, it is very difficult to set the gate wire width to 10 nm or less by micro processing. Even when increasing a concentration of impurities to be implanted in a P-type or N-type source•drain region, the enhancement of the driving force of the MOS-FET can be expected. However, there is trade-off between the impurity concentration and frequency of generation of crystal defects, and it is technically difficult to enhance the force by the increasing of the concentration.

Moreover, in Jpn. Pat. Appln. KOKAI Publication No. 2003-60076, there is described a semiconductor device including: a nitride film coating an n-channel MOSFET and having an intrinsic tensile stress; and a nitride film coating a p-channel MOSFET and having an intrinsic compressive stress.

In Jpn. Pat. No. 3441259, there is described a semiconductor device comprising: a semiconductor substrate having a first trench filled with a first material; a semiconductor layer formed on the semiconductor substrate and having a second trench filled with a second material; and a semiconductor element formed on the semiconductor layer. The first material has a thermal expansion coefficient which is different from that of the semiconductor substrate, and a thermal expansion coefficient difference between the second material and the semiconductor layer is smaller than that between the first material and the semiconductor substrate.

BRIEF SUMMARY OF THE INVENTION

According to an aspect of the invention, there is provided a semiconductor device provided with a CMOS-FET circuit, comprising: at least one of a tensile stress film disposed in a part of an element isolating film around an NMOS forming region and having a tensile stress, and a compressive stress film disposed in a part of an element isolating film around a PMOS forming region and having a compressive stress.

According to another aspect of the invention, there is provided a method of manufacturing a semiconductor device provided with a CMOS-FET circuit, comprising: forming an element isolating film on a semiconductor substrate; forming a first trench in a part of the element isolating film around an NMOS forming region; burying a tensile stress film in the first trench; forming a second trench in a part of the element isolating film around a PMOS forming region; and burying a compressive stress film in the second trench.

BRIEF DESCRIPTION OF THE SEVERAL VIEWS OF THE DRAWING

FIG. 1 is a sectional view showing a procedure for manufacturing a semiconductor device according to a first embodiment;

FIG. 2 is a sectional view showing the procedure for manufacturing the semiconductor device according to the first embodiment;

DETAILED DESCRIPTION OF THE INVENTION

Figure 3:
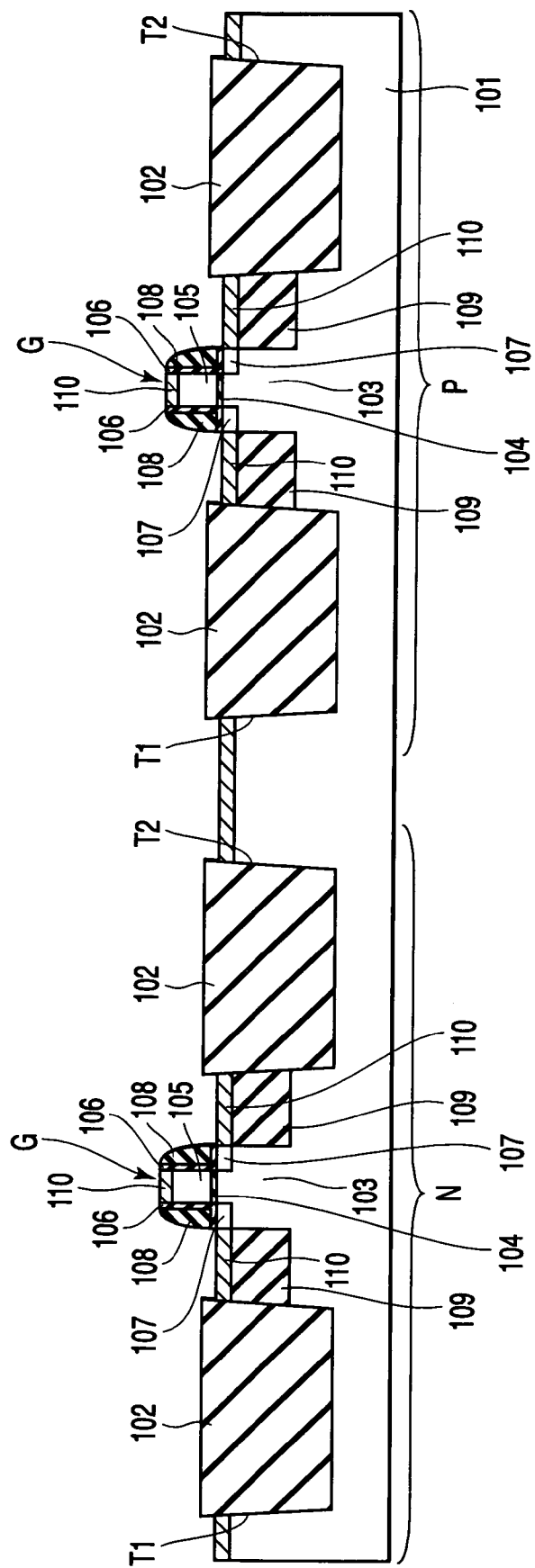
FIG. 3 is a sectional view showing the procedure for manufacturing the semiconductor device according to the first embodiment.

Embodiments of the present invention will be described hereinafter with reference to the drawings.

FIGS. 1 to 10 are sectional views showing a procedure for manufacturing a semiconductor device provided with a CMOS-FET circuit according to a first embodiment of the present invention. The procedure for manufacturing the semiconductor device will be described hereinafter according to the first embodiment with reference to FIGS. 1 to 10.

First, as shown in FIG. 1, a first silicon nitride film (SiN film: not shown) having a film thickness of 150 nm is formed on a silicon (Si) substrate (bulk Si substrate) 101 by an LPCVD process, the first SiN film is coated with a first resist (not shown), and the first resist is patterned by a lithography process. Next, the first SiN film is separated using the first resist as a mask by an RIE process. When the Si substrate 101 is etched by 300 nm, and the first resist is peeled to thereby form STI trenches T1, T2 for N-type and P-type element regions.

Moreover, a first insulating film 102 is deposited on the whole surface of the structure to fill in the STI trenches T1, T2. The first insulating film 102 is flattened by a CMP process using the first SiN film as a stopper. Next, the first insulating film 102 is etched by about 100 nm, in order to align the upper surface of the first insulating film 102 with that of the Si substrate 101, and the first SiN film is completely peeled by the etching to thereby form an element isolating region.

Next, as shown in FIG. 2, in order to form the N-type and P-type element regions, impurities are implanted in the Si substrate 101, thermal treatment is performed at 1000° C. or more, and N-type and P-type well channel regions 103 are formed on the upper surface of the Si substrate 101. Next, a gate insulating film 104 is formed into a film thickness of about 1 nm on the Si substrate 101, and a polycrystal silicon film 105 having a film thickness of 150 nm is formed on the gate insulating film 104 by the LPCVD process.

Moreover, the polycrystal silicon film 105 is coated with a second resist (not shown), and the second resist is patterned by the lithography process. The polycrystal silicon film 105 is separated by the RIE process using the second resist as a mask, and the second resist is peeled to form a gate conductor (GC) pattern G. The gate insulating film 104 other than a GC pattern G portion on the Si substrate 101 is completely peeled by wet etching.

Next, as shown in FIG. 3, impurities are implanted in the N-type and P-type well channel regions 103, respectively, and heat treatment is performed at about 800° C. to form lightly doped drains (LDDs) 107. Thereafter, a second insulating film 106 having a film thickness of about 20 nm is formed on the whole surface of the structure by the LPCVD process, a second SiN film 108 having a film thickness of about 70 nm is formed on the second insulating film 106 by the LPCVD process, and the second SiN film 108 and the second insulating film 106 are etched back by the RIE process. A side wall is formed on the side surface of the GC pattern G by the second insulating film 106 and the second SiN film 108.

Thereafter, impurities are implanted in the GC patterns G, LDD 107 regions, and well channel regions 103 of the N-type and P-type, respectively, and they are annealed at 1000° C. or more to thereby form source•drain regions 109. Moreover, Ni salicide 110 is selectively formed only on the upper surfaces of the source•drain regions 109 and GC patterns G, for example, by a salicide process using Ni, and metal wires are formed in upper portions of the GC patterns G and active area (AA) patterns.

Figure 4A:
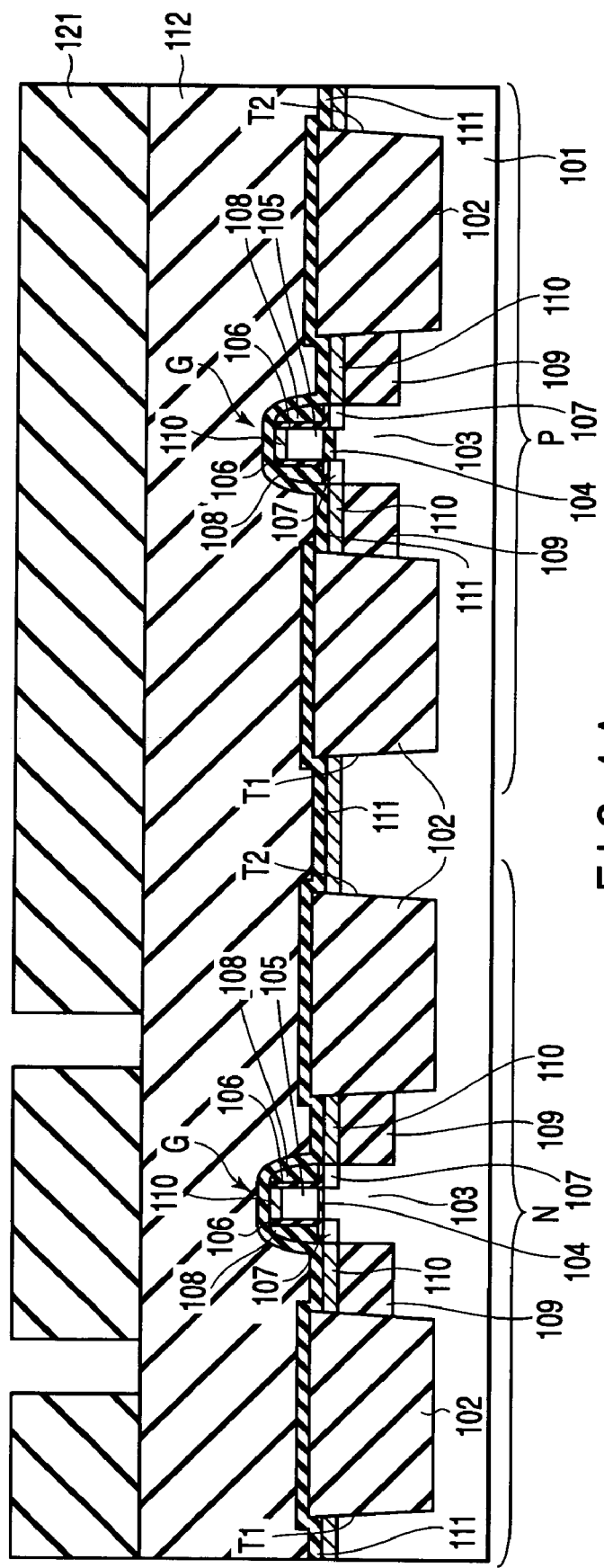
FIG. 4A is a sectional view showing the procedure for manufacturing the semiconductor device according to the first embodiment.
Figure 4B:
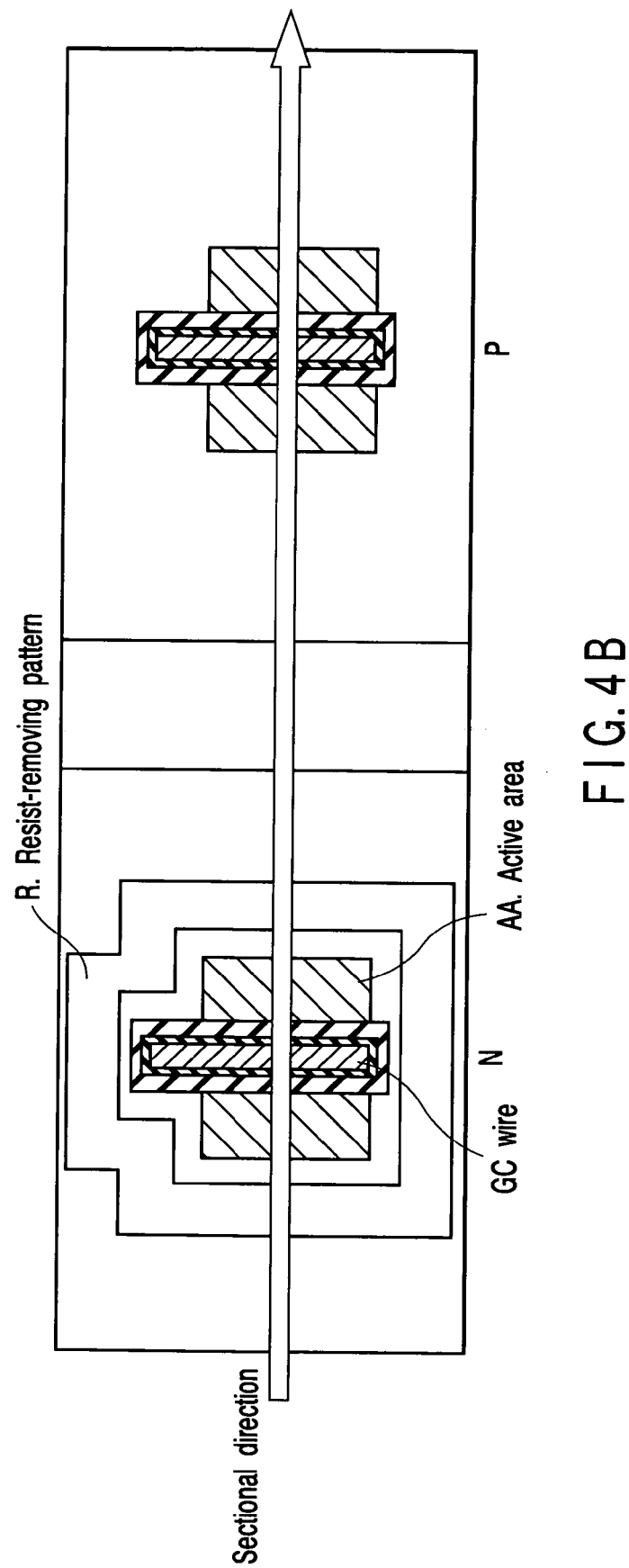
FIG. 4B is a plan view showing the procedure for manufacturing the semiconductor device according to the first embodiment.

Next, as shown in FIG. 4A, a third insulating film 111 having a film thickness of 30 nm is formed on the whole surface of the structure by the LPCVD process. A second $SiO_2$ film 112 having a film thickness of 400 nm is formed on the third insulating film 111 by the LPCVD process, and the second $SiO_2$ film 112 is flattened by the CMP process. The second $SiO_2$ film 112 is coated with a first resist 121. When the first resist 121 is patterned by the lithography process, as shown in FIG. 4B, resist-removing patterns R are formed around a single or a plurality of N-type active areas AA. It is to be noted that FIG. 4B shows a plan view of FIG. 4A.

Figure 5A:
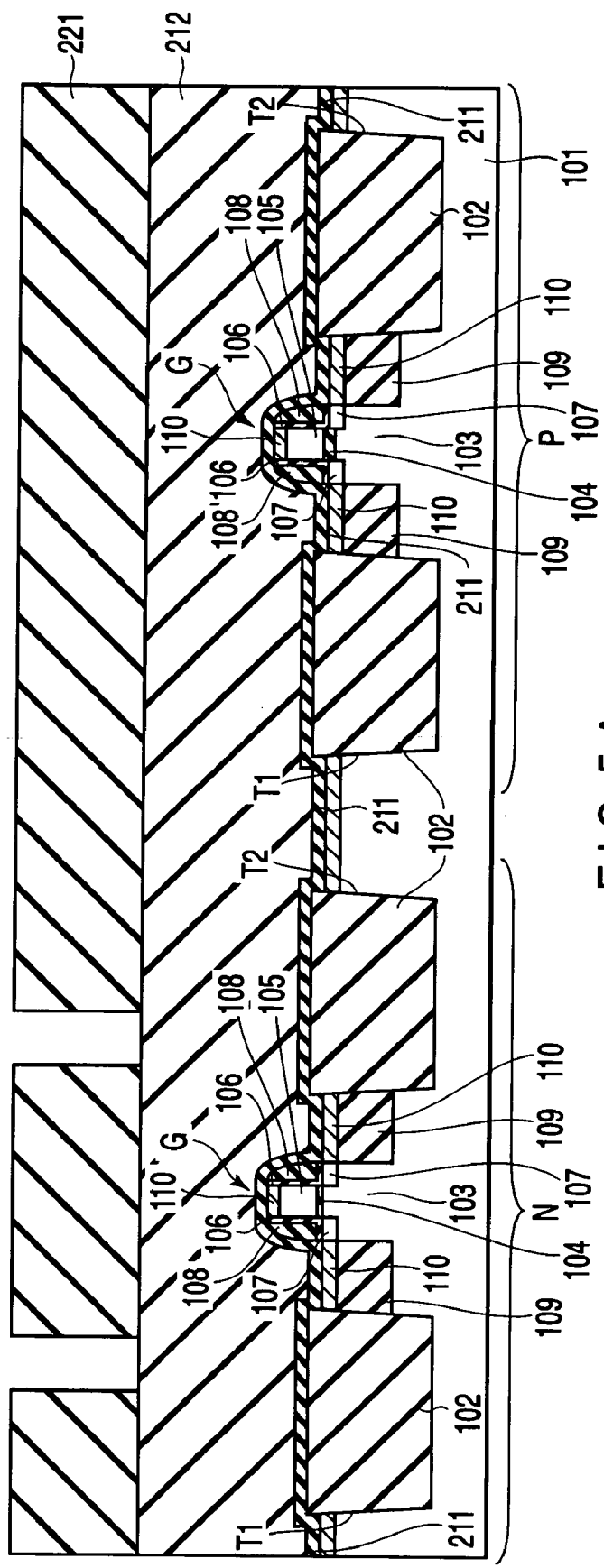
FIG. 5A is a sectional view showing the procedure for manufacturing the semiconductor device according to the first embodiment.
Figure 5B:
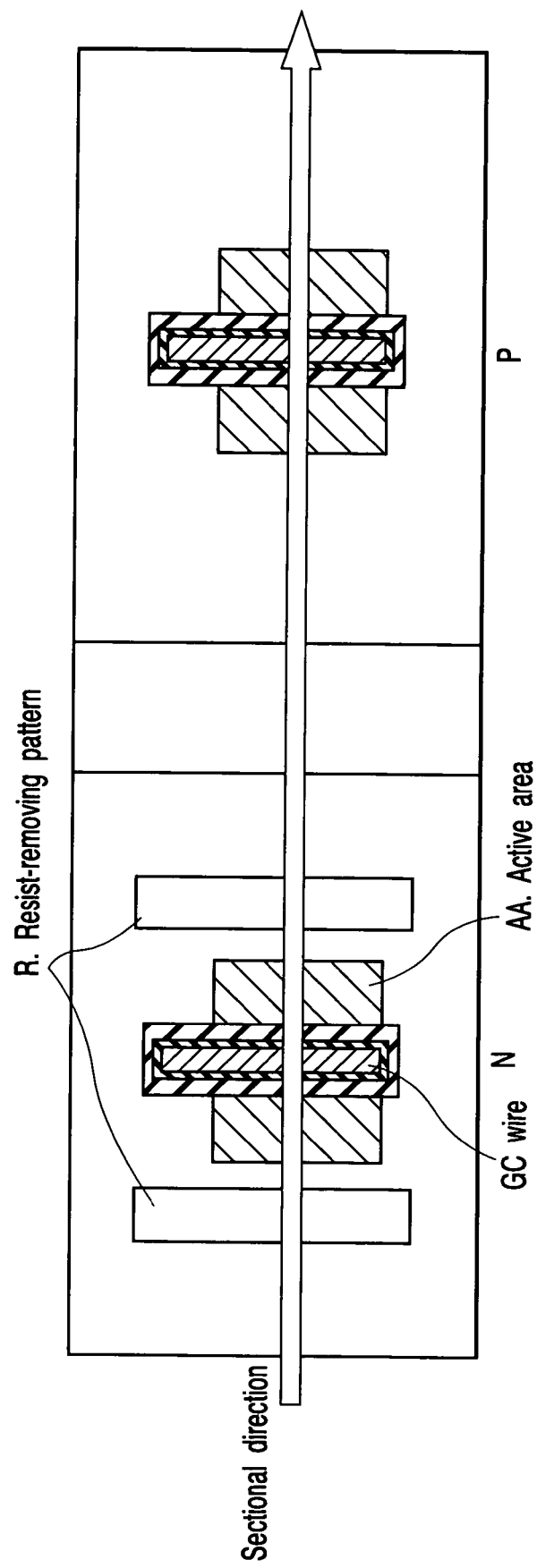
FIG. 5B is a plan view showing the procedure for manufacturing the semiconductor device according to the first embodiment.
Figure 6A:
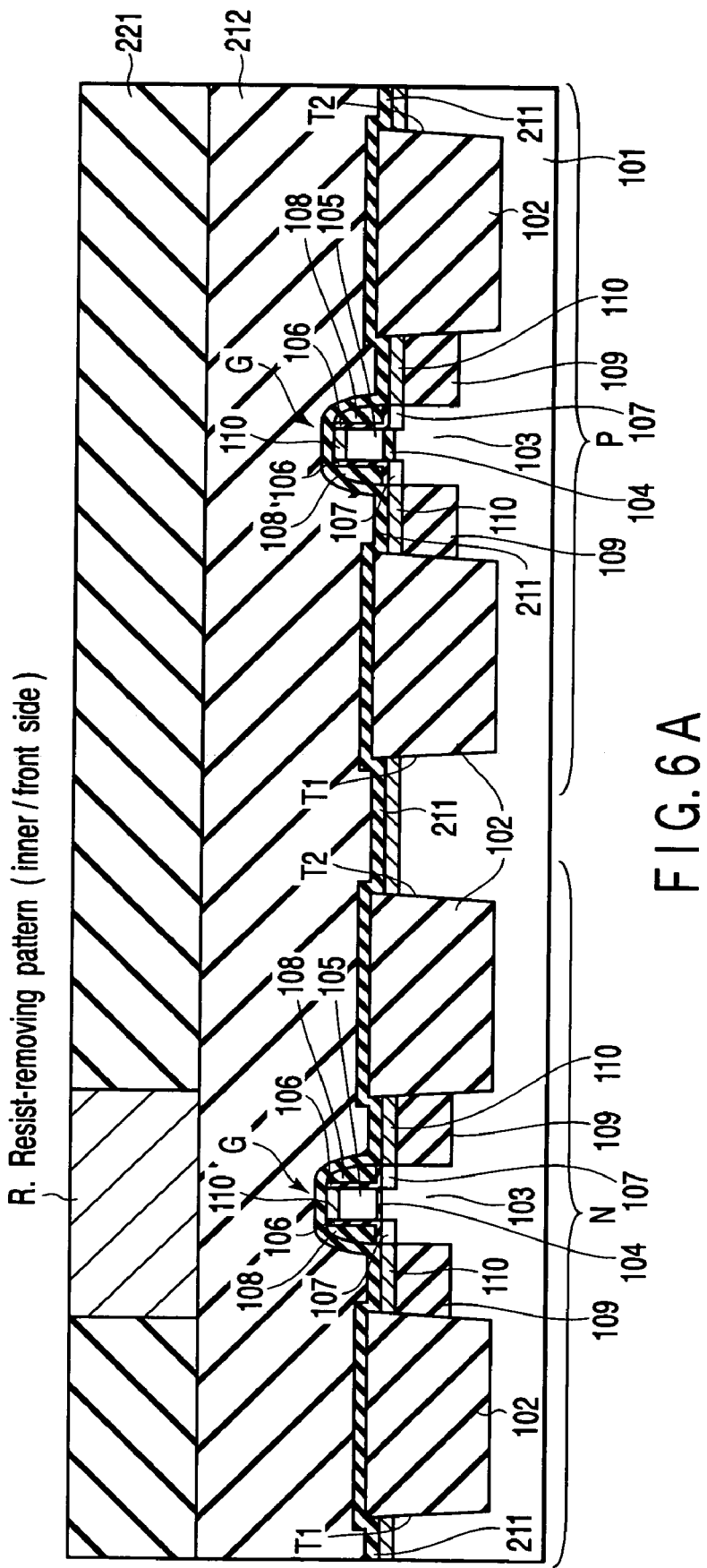
FIG. 6A is a sectional view showing the procedure for manufacturing the semiconductor device according to the first embodiment.
Figure 6B:
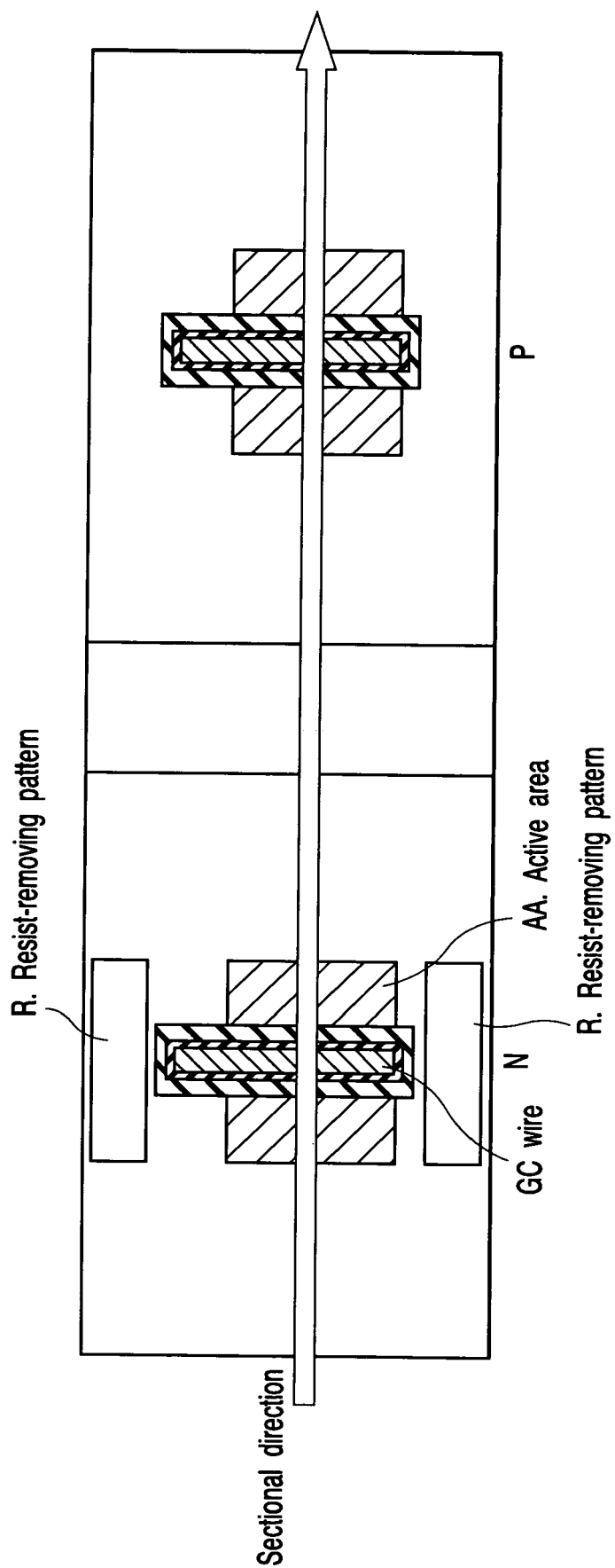
FIG. 6B is a plan view showing the procedure for manufacturing the semiconductor device according to the first embodiment.

Moreover, a method shown in FIGS. 5A and 5B or FIGS. 6A and 6B may be performed instead of the method shown in FIGS. 4A and 4B. As shown in FIGS. 5A and 5B, resist-removing patterns R are formed in parallel with the GC pattern G in a part of an element isolating film around a single or a plurality of N-type active areas AA. It is to be noted that FIG. 5B shows a plan view of FIG. 5A. As shown in FIGS. 6A and 6B, resist-removing patterns R are formed in a vertical direction with respect to the GC pattern G in a part of an element isolating film around a single or a plurality of N-type active areas AA. It is to be noted that FIG. 6B shows a plan view of FIG. 6A. FIG. 6A shows the resist-removing pattern R which exists on the front side. The methods shown in FIGS. 5A and 5B and FIGS. 6A and 6B can also obtain the effects. It is to be noted that the resist-removing patterns R shown in FIGS. 5B and 6B are the patterns which are formed in place of the first resist 121 shown in FIG. 4A. The methods shown in FIGS. 4A and 4B, FIGS. 5A and 5B, and FIGS. 6A and 6B can be applied to the PMOS forming region as well as the NMOS forming region. It is to be noted that stresses are enlarged in response to the volumes of the tensile stress film and the compressive stress film. Therefore, the driving force can be further increased by forming the resist-removing pattern R in such a manner as to surround the active area as shown in FIG. 4B.

Figure 7:
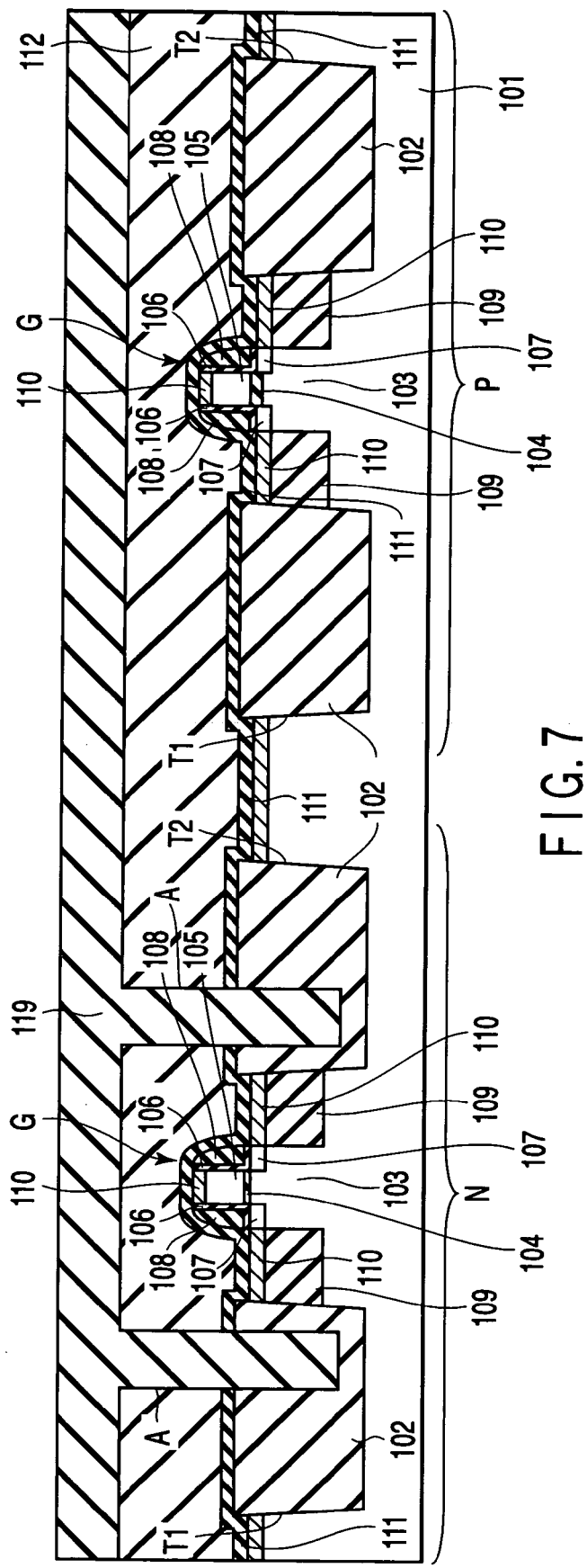
FIG. 7 is a sectional view showing the procedure for manufacturing the semiconductor device according to the first embodiment.

Next, as shown in FIG. 7, the second $SiO_2$ film 112 and the third insulating film 111 are separated using the first resist 121 as a mask, and further the first insulating films 102, 102 around the NMOS forming region are etched by the RIE process to form trenches A, A. These trenches A, A are formed in such a manner that each trench does not reach the element region and STI trench bottom. Moreover, a third SiN film 119 is formed into a film thickness which is substantially equal to a short-side width of the trench A by the LPCVD process, specifically by a reduced-pressure CVD process using dichlorosilane and ammonia to fill in the trenches A, A, and the third SiN film 119 is flattened by the CMP process. In this case, the third SiN film 119 on the second $SiO_2$ film 112 is left without being shaved off. The third SiN film 119 is coated with a second resist (not shown). When the second resist is patterned by the lithography process, resist-removing patterns are formed around a single or a plurality of P-type active areas.

Figure 8:
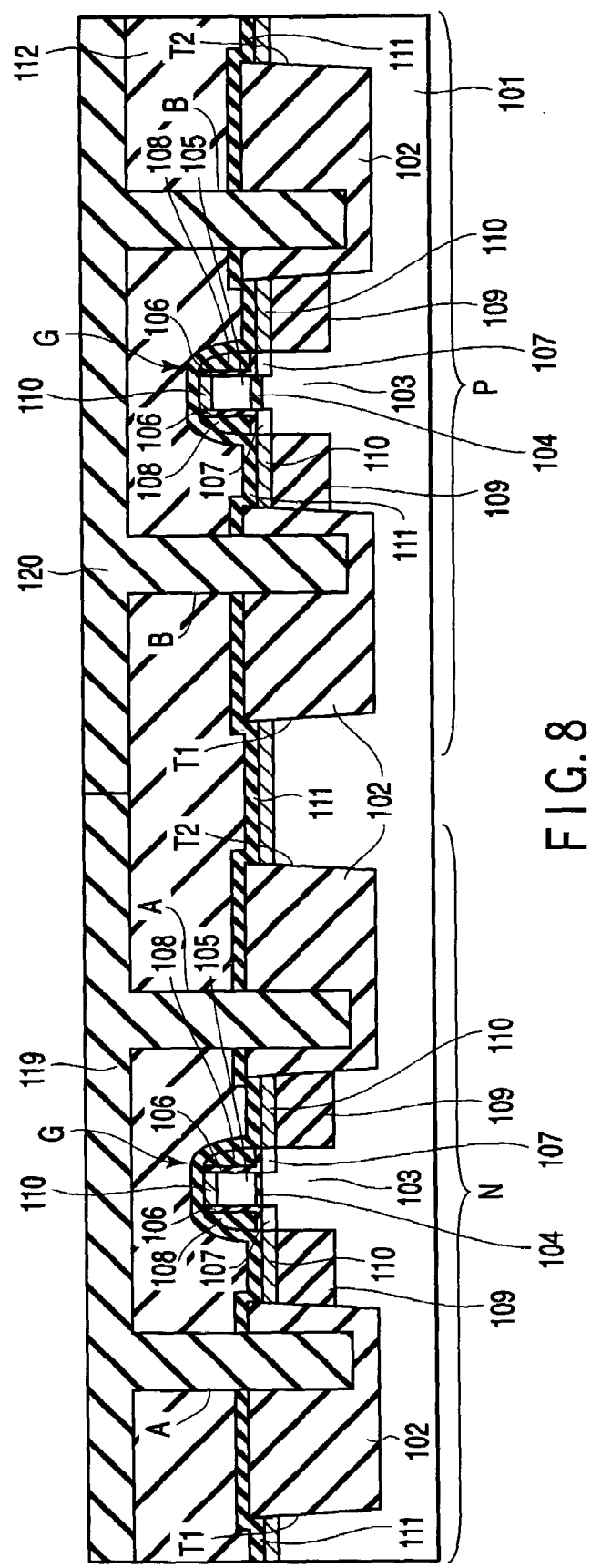
FIG. 8 is a sectional view showing the procedure for manufacturing the semiconductor device according to the first embodiment.

Next, as shown in FIG. 8, the second $SiO_2$ film 112 and the third insulating film 111 are separated using the second resist as a mask, further the first insulating films 102, 102 around the PMOS forming region are etched by the RIE process, and trenches B, B are formed in the same manner as in the trenches A, A. Moreover, a fourth SiN film 120 is formed into a film thickness which is substantially equal to a short-side width of the trench B by a plasma CVD, specifically, a plasma CVD process using monosilane and ammonia to fill in the trenches B, B, and the fourth SiN film 120 is flattened by the CMP process. In this case, the fourth SiN film 120 and the third SiN film 119 on the second $SiO_2$ film 112 are left without being shaved off.

Figure 9:
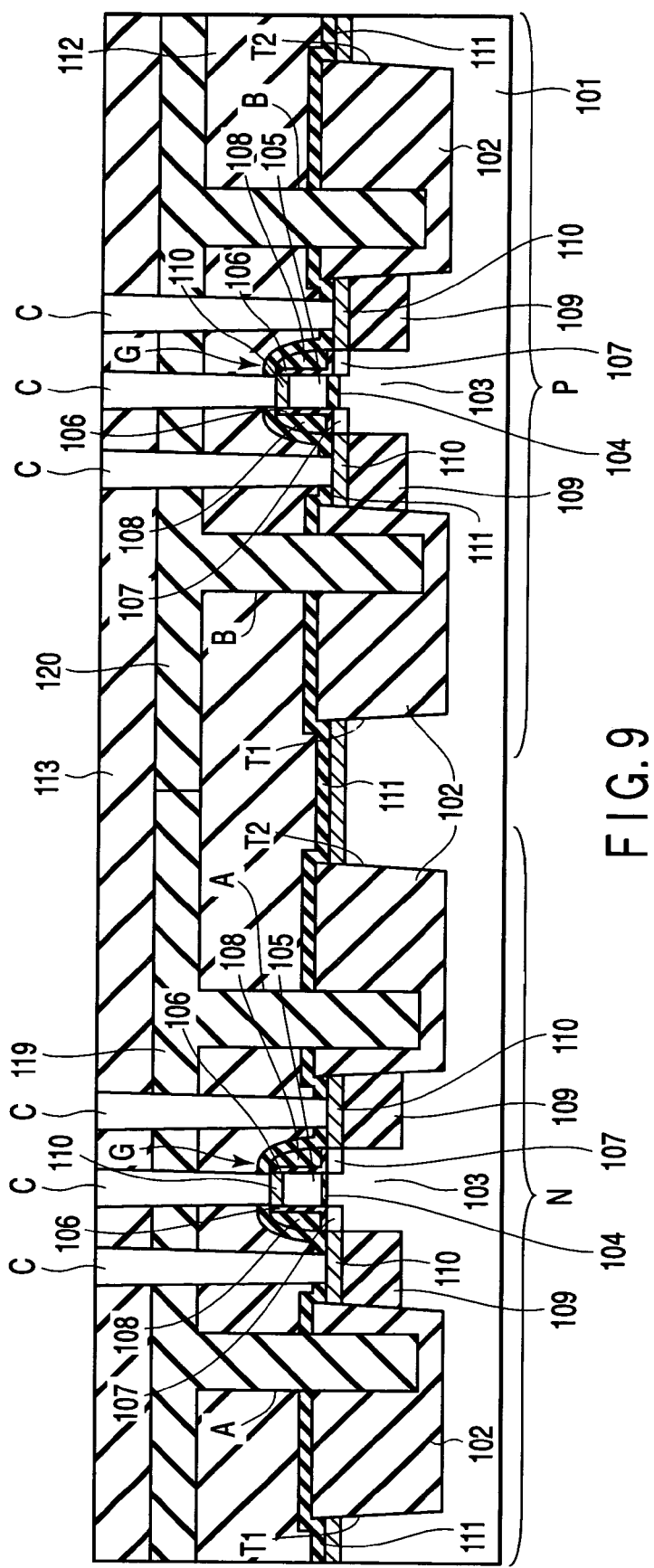
FIG. 9 is a sectional view showing the procedure for manufacturing the semiconductor device according to the first embodiment.

Next, as shown in FIG. 9, a fourth insulating film 113 having a film thickness of 200 nm is formed by the plasma CVD process. Moreover, the fourth insulating film 113 is coated with a third resist (not shown), and the third resist is patterned by the lithography process. The fourth insulating film 113, fourth SiN film 120, and third SiN film 119, and the second $SiO_2$ film 112 and third insulating film 111 are etched by the RIE process using the third resist as a mask. When the third resist is peeled, a plurality of contact holes C are formed with respect to the respective GC patterns and active areas of the N-type and P-type.

Figure 10:
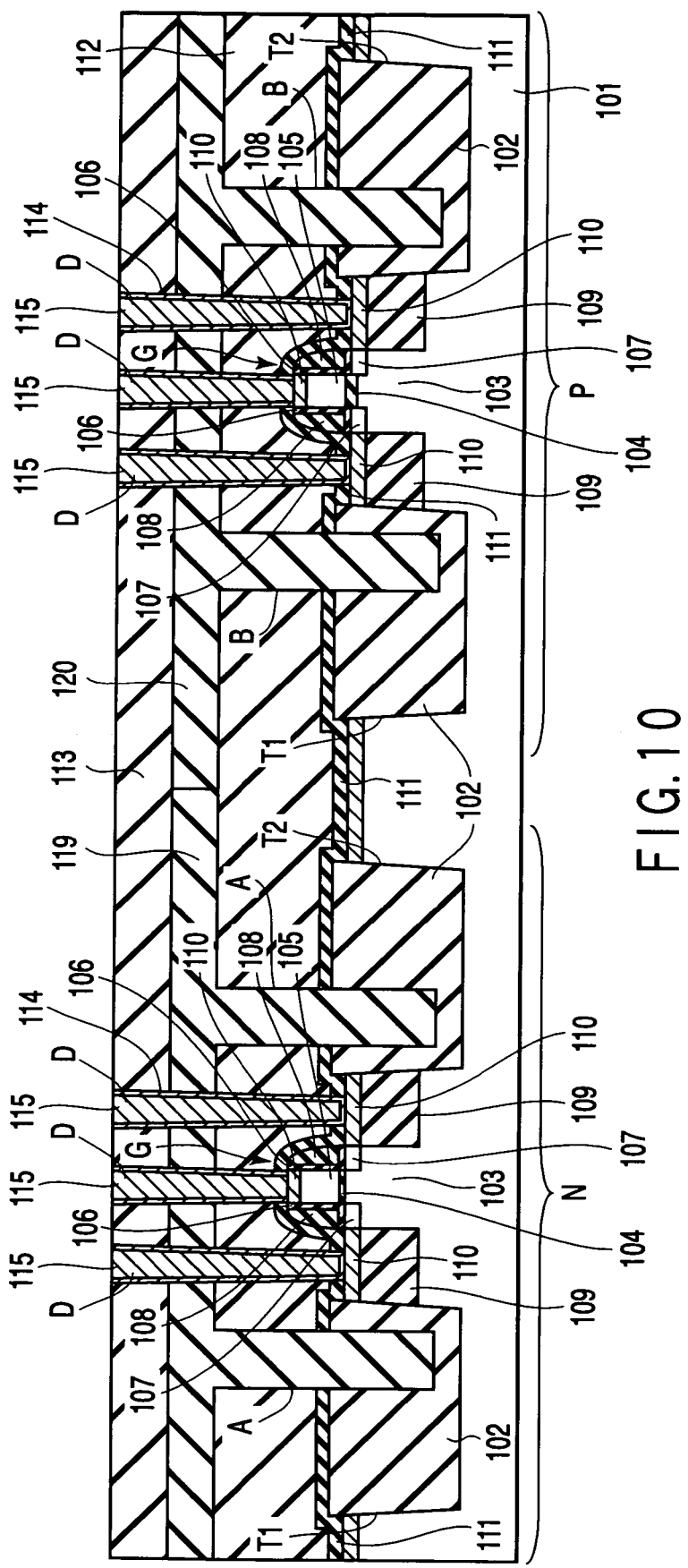
FIG. 10 is a sectional view showing the procedure for manufacturing the semiconductor device according to the first embodiment.

Next, as shown in FIG. 10, a first barrier metal 114 having a film thickness of 30 nm is formed on the whole surface of the structure by a sputtering process, and a tungsten film 115 having a film thickness of 250 nm is formed on the first barrier metal 114 by a thermal CVD process to fill in the respective contact holes C. Moreover, the tungsten film 115 and first barrier metal 114 on the fourth insulating film 113 are shaved off by the CMP process to thereby form contacts D.

Thereafter, multi-layered wires and pads are formed in the same manner as in a conventional technique, and the description is therefore omitted.

In the semiconductor device manufactured as described above, the third SiN film 119 is disposed in a part of the first insulating film 102 which is an element isolating film in such a manner that the third SiN film surrounds an NMOS type active area around which the element is isolated. The third SiN film 119 is a tensile stress film, and formed by the LPCVD process. Since a compressive stress existing in the NMOS type active area is relaxed by a tensile stress by the third SiN film 119, an NMOS driving force ($I_{on}$: ON-current) increases. The fourth SiN film 120 is disposed in a part of the first insulating film 102 which is an element isolating film in such a manner that the fourth SiN film surrounds a PMOS type active area around which the element is isolated. The fourth SiN film 120 is a compressive stress film, and formed by the plasma CVD process. Since a compressive stress existing in the PMOS type active area is accelerated by a compressive stress by the fourth SiN film 120, a PMOS driving force ($I_{on}$) increases.

The tensile stress film and compressive stress film are formed in such a manner as to surround the NMOS-type and PMOS-type active areas each including a gate electrode. That is, the films are formed in such a manner that the upper surfaces of the tensile stress film and the compressive stress film are higher than the upper surface of the element isolating film. It is to be noted that when the tensile stress film and the compressive stress film are formed on a part of the element isolating film, the driving force can be increased. Additionally, when the tensile stress film and the compressive stress film are formed in such a manner as to surround the active area including a part of each of NMOS-type and PMOS-type gates, the tensile stress and compressive stress are more preferably enlarged in proportion to volumes. When the tensile stress film and the compressive stress film are extended in such a manner as to surround the side surface and upper surface of the active area, the driving force can be further increased.

Moreover, since the structure can be treated by a process at a low temperature after forming the MOS-FET, there is little fear of crystal defects.

It is to be noted that in addition to the bulk Si substrate, a semiconductor-on-insulator (SOI) substrate is usable in the Si substrate 101, and a similar effect is obtained even in this case. The effect of increasing the driving force is obtained, even when disposing only one of the tensile stress film disposed in a part of the element isolating film around the NMOS forming region, and the compressive stress film disposed in a part of the element isolating film around the PMOS forming region.

FIGS. 11 to 16 are sectional views showing a procedure for manufacturing a semiconductor device provided with a CMOS-FET circuit according to a second embodiment of the present invention. The procedure for manufacturing the semiconductor device will be described hereinafter according to the second embodiment with reference to FIGS. 11 to 16.

In the manufacturing procedure of the second embodiment, first the procedure is performed as shown in FIGS. 1 to 4A of the first embodiment.

Figure 11:
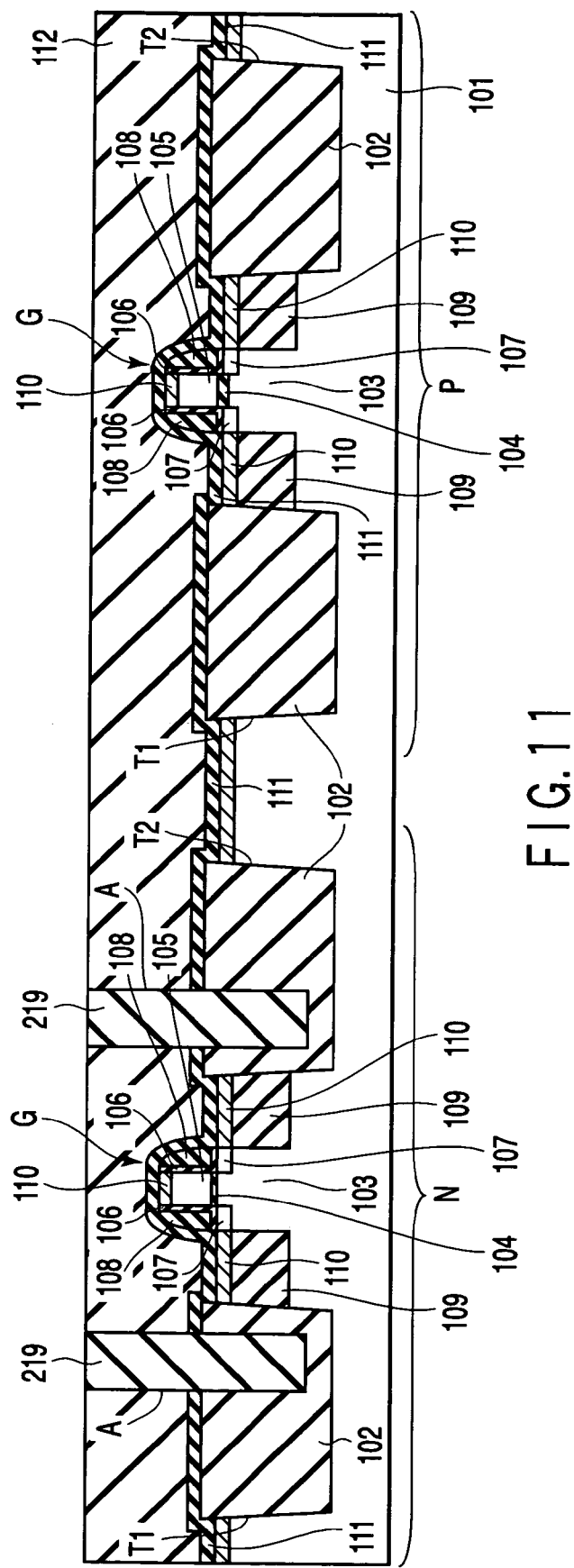
FIG. 11 is a sectional view showing a procedure for manufacturing a semiconductor device according to a second embodiment.

Next, using the first resist 121 shown in FIG. 4A as a mask, as shown in FIG. 11, a second $SiO_2$ film 112 and a third insulating film 111 are separated, further the first insulating films 102, 102 around the NMOS forming region are etched by an RIE process to form trenches A, A. The trenches A, A are formed in such a manner that each of the trenches does not reach an element region or STI trench bottom. Moreover, a metal film 219 is formed by a sputtering or thermal CVD process. In this case, a titanium film or a titanium nitride film is formed by the sputtering process, and a titanium film, a tungsten film, or an alloy film containing titanium and tungsten is formed by the thermal CVD process. Even when any film is used, the film is formed into a film thickness which is substantially equal to a short-side width of the trench A to fill in the trenches A, A, and the metal film 219 is flattened by a CMP process. In this case, the metal film 219 on the second $SiO_2$ film 112 is shaved off. The whole surface of the structure is coated with a second resist (not shown). When the second resist is patterned by a lithography process, resist-removing patterns are formed around a single or a plurality of P-type active areas.

Figure 12A:
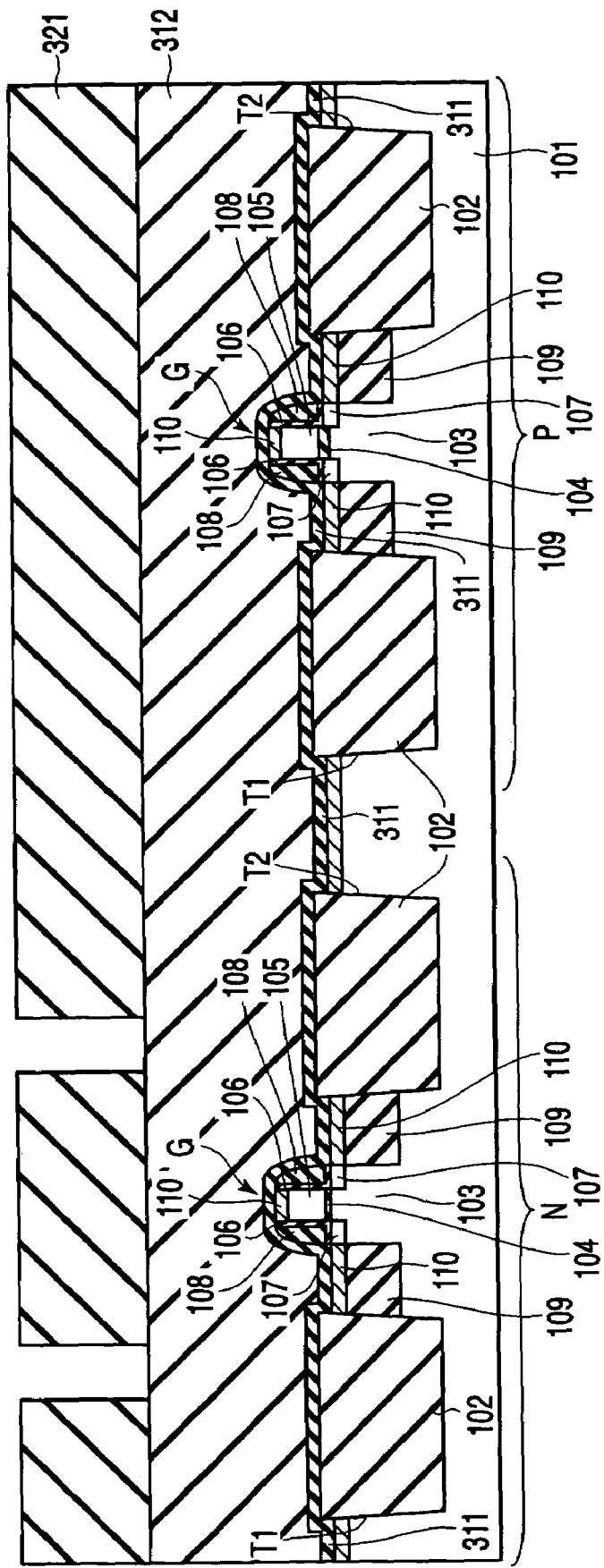
FIG. 12A is a sectional view showing the procedure for manufacturing the semiconductor device according to the second embodiment.
Figure 12B:
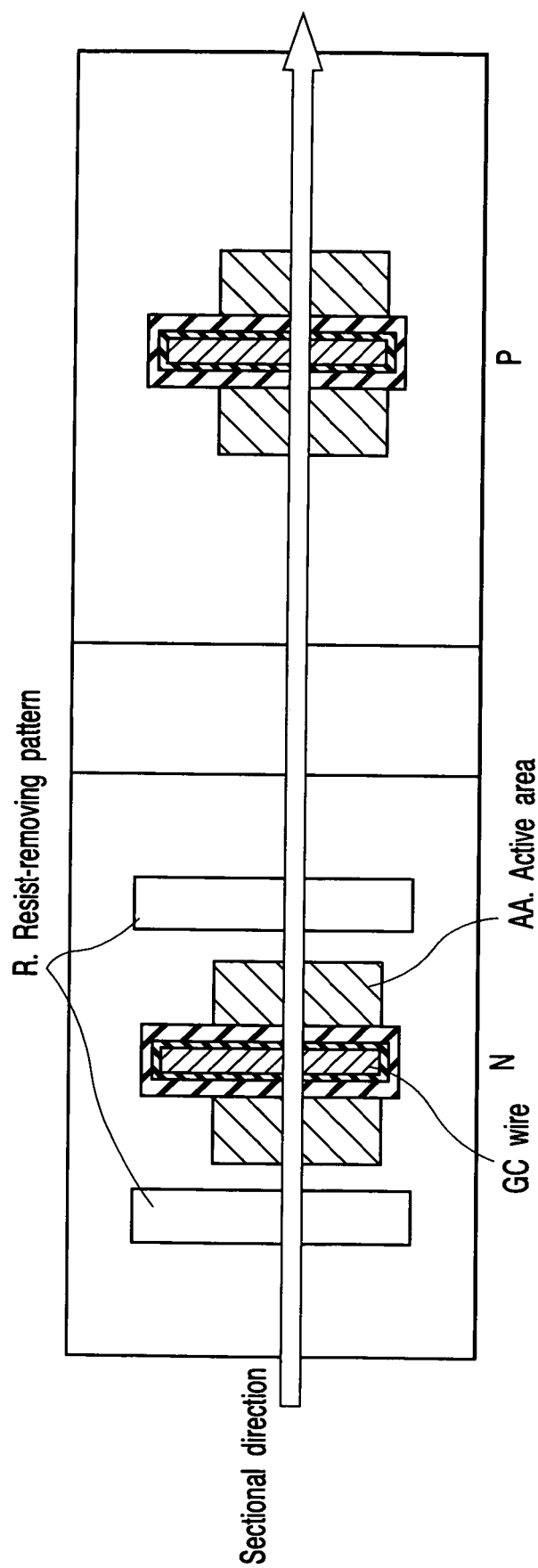
FIG. 12B is a plan view showing the procedure for manufacturing the semiconductor device according to the second embodiment.
Figure 13A:
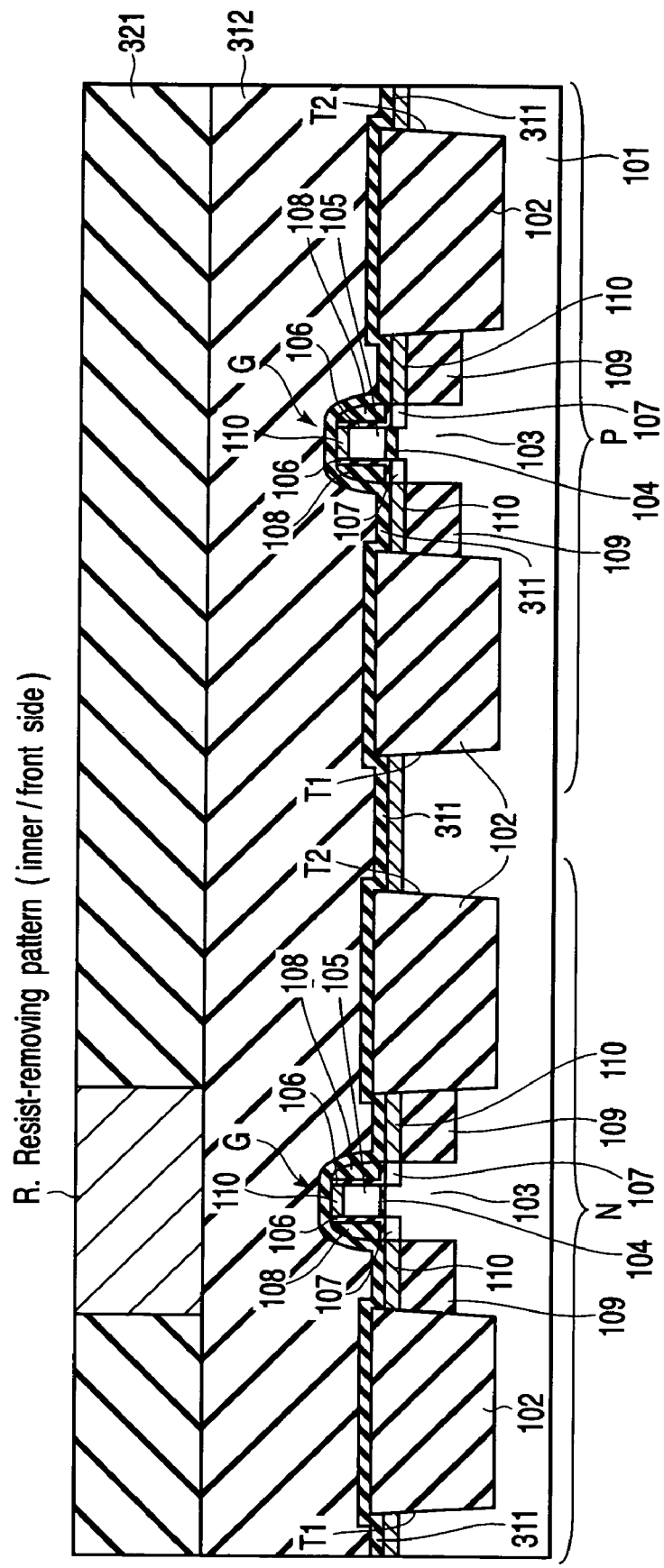
FIG. 13A is a sectional view showing the procedure for manufacturing the semiconductor device according to the second embodiment.
Figure 13B:
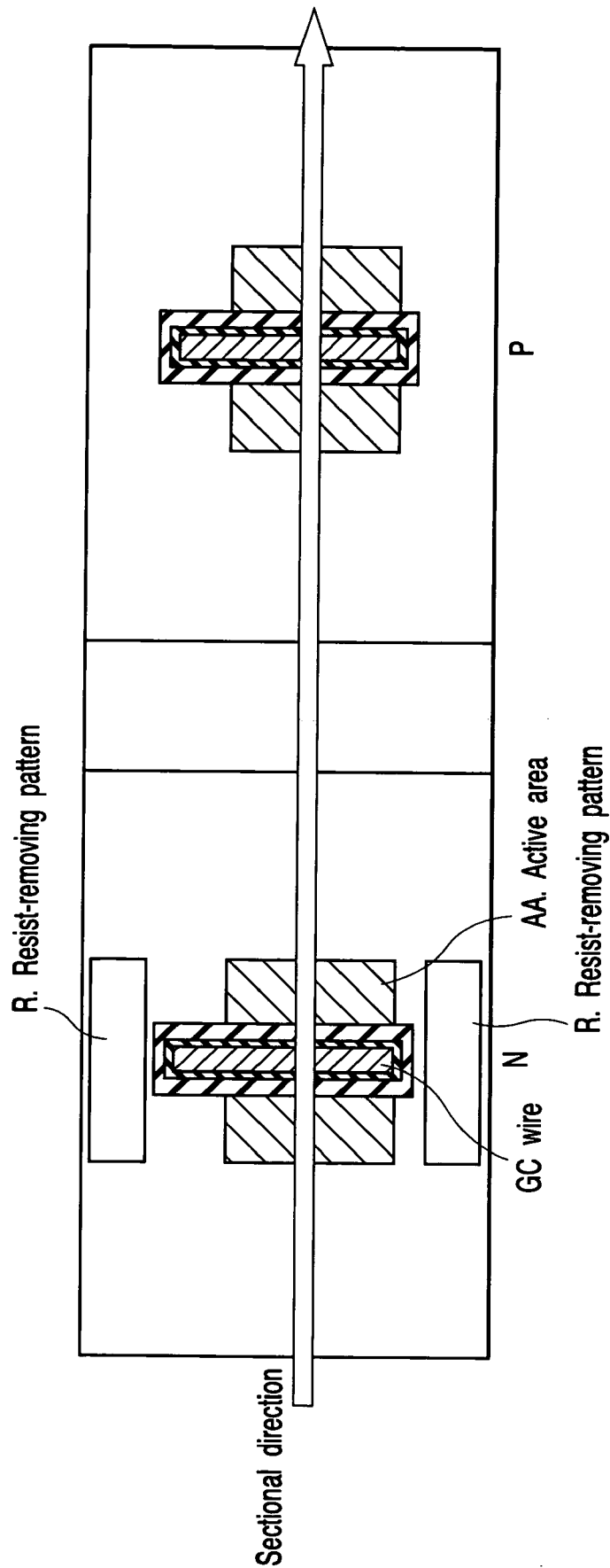
FIG. 13B is a plan view showing the procedure for manufacturing the semiconductor device according to the second embodiment.

As shown in FIGS. 12A and 12B, resist-removing patterns R are formed in parallel with a GC pattern G in a part of an element isolating film around a single or a plurality of N-type active areas AA. It is to be noted that FIG. 12B shows a plan view of FIG. 12A. Moreover, a method shown in FIGS. 13A and 13B may be performed instead of the method shown in FIGS. 12A and 12B. As shown in FIGS. 13A and 13B, resist-removing patterns R are formed in a vertical direction with respect to the GC pattern G in a part of an element isolating film around a single or a plurality of N-type active areas AA. It is to be noted that FIG. 13B shows a plan view of FIG. 13A. FIG. 13A shows the resist-removing pattern R which exists on the front side. The method shown in FIGS. 13A and 13B can obtain the same effects as those of the method shown in FIGS. 12A and 12B. The methods shown in FIGS. 12A and 12B and FIGS. 13A and 13B can be applied to the PMOS forming region as well as the NMOS forming region.

Figure 14:
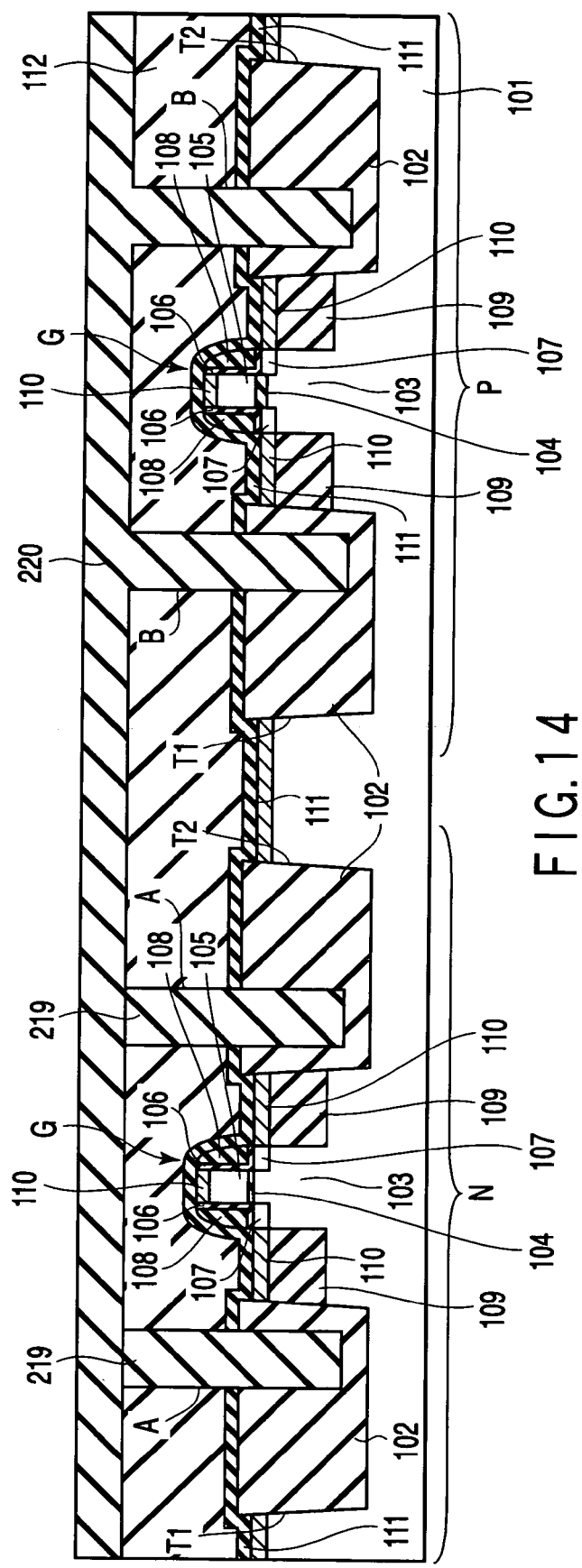
FIG. 14 is a sectional view showing the procedure for manufacturing the semiconductor device according to the second embodiment.

Next, as shown in FIG. 14, the second $SiO_2$ film 112 and the third insulating film 111 are separated using the second resist as a mask, further the first insulating films 102, 102 around the PMOS forming region are etched by the RIE process, and trenches B, B are formed in the same manner as in the trenches A, A. Moreover, a third SiN film 220 is formed into a film thickness which is substantially equal to a short-side width of the trench B by a plasma CVD, specifically, a plasma CVD process using monosilane and ammonia to fill in the trenches B, B, and the third SiN film 220 is flattened by the CMP process. In this case, the third SiN film 220 on the second SiO$_2$ film 112 is left without being shaved off.

Figure 15:
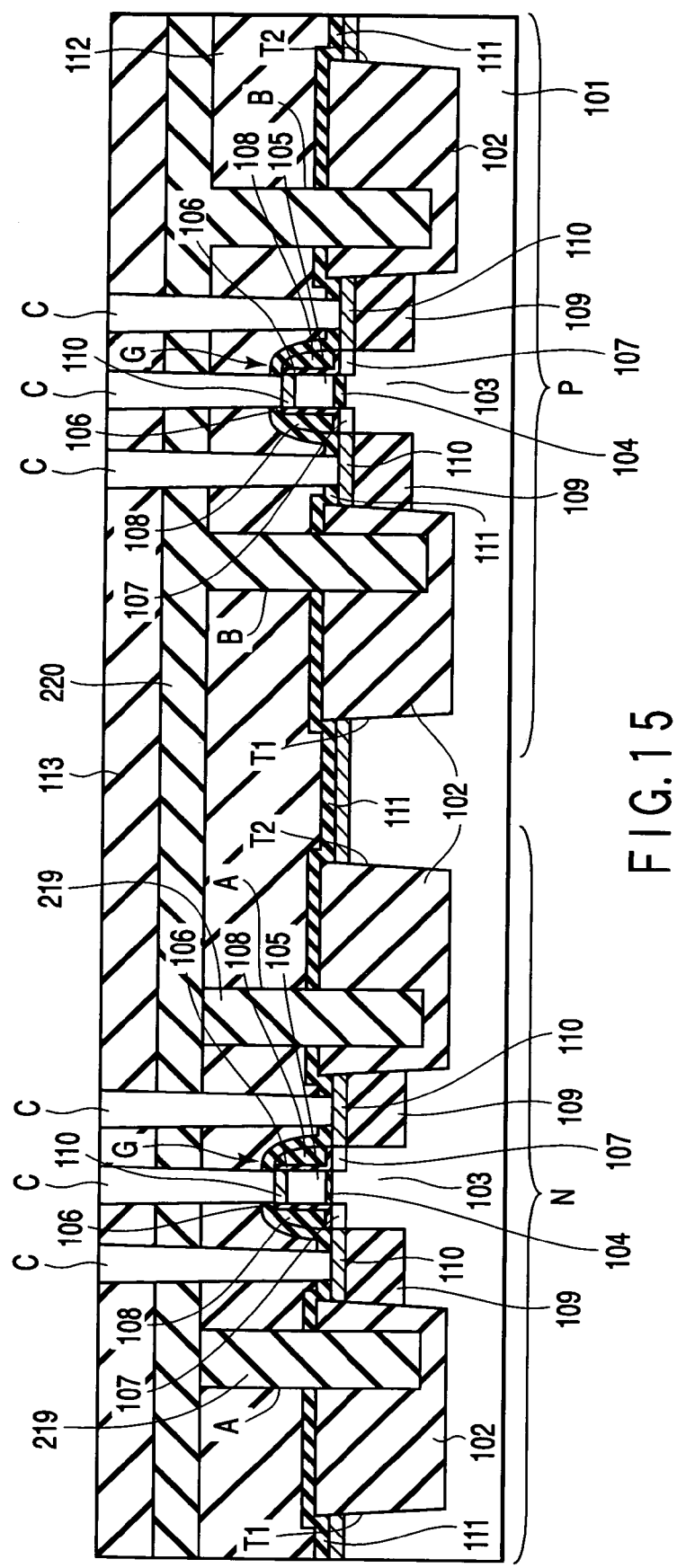
FIG. 15 is a sectional view showing the procedure for manufacturing the semiconductor device according to the second embodiment.

Next, as shown in FIG. 15, a fourth insulating film 113 having a film thickness of 200 nm is formed by the plasma CVD process. Moreover, the fourth insulating film 113 is coated with a third resist (not shown), and the third resist is patterned by the lithography process. The fourth insulating film 113 and third SiN film 220, and the second SiO$_2$ film 112 and third insulating film 111 are etched by the RIE process using the third resist as a mask. When the third resist is peeled, a plurality of contact holes C are formed with respect to the respective GC patterns and active areas of the N-type and P-type.

Figure 16:
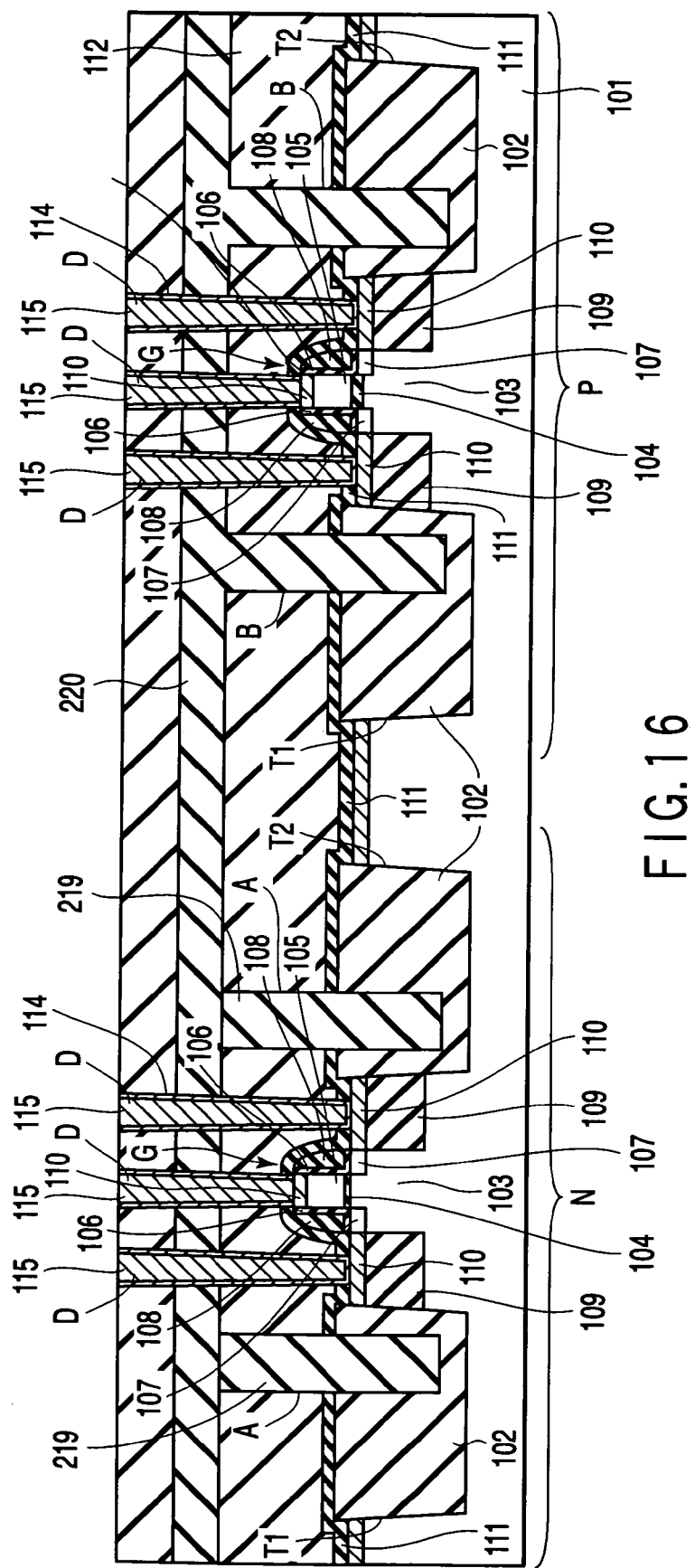
FIG. 16 is a sectional view showing the procedure for manufacturing the semiconductor device according to the second embodiment.

Next, as shown in FIG. 16, a first barrier metal 114 having a film thickness of 30 nm is formed on the whole surface of the structure by a sputtering process, and a tungsten film 115 having a film thickness of 250 nm is formed on the first barrier metal 114 by a thermal CVD process to fill in the respective contact holes C. Moreover, the tungsten film 115 and first barrier metal 114 on the fourth insulating film 113 are shaved off by the CMP process to thereby form contacts D.

Thereafter, multi-layered wires and pads are formed in the same manner as in a conventional technique, and the description is therefore omitted.

In the semiconductor device manufactured as described above, the metal film 219 is disposed in a part of the first insulating film 102 which is an element isolating film in such a manner that the metal film surrounds an NMOS type active area around which the element is isolated. The metal film 219 is a tensile stress film, and formed by the sputtering or thermal CVD process. Since a compressive stress existing in the NMOS type active area is relaxed by a tensile stress by the metal film 219, an NMOS driving force ($I_{on}$) increases. The third SiN film 220 is disposed in a part of the first insulating film 102 which is an element isolating film in such a manner that the third SiN film surrounds a PMOS type active area around which the element is isolated. The third SiN film 220 is a tensile stress film, and formed by the plasma CVD process. Since a compressive stress existing in the PMOS type active area is accelerated by a compressive stress by the third SiN film 220 by the plasma CVD process, a PMOS driving force ($I_{on}$) increases.

Moreover, since the structure can be treated by a process at a low temperature after forming the MOS-FET, there is little fear of crystal defects.

Furthermore, the tensile stress film and the compressive stress film may be formed in a part of the element isolating film in the same manner as in the first embodiment, but the films may be preferably formed on the side surface of the active area because a volume increases. When the tensile stress film and the compressive stress film are extended/formed in such a manner as to surround the side surface and the upper surface of the active area, a driving force is further easily transmitted.

It is to be noted that in addition to the bulk Si substrate, a semiconductor-on-insulator (SOI) substrate is usable in the Si substrate 101, and a similar effect is obtained even in this case. The effect of increasing the driving force is obtained, even when disposing only one of the tensile stress film disposed in a part of the element isolating film around the NMOS forming region, and the compressive stress film disposed in a part of the element isolating film around the PMOS forming region.

According to the embodiments of the present invention, there can be provided a high-performance semiconductor device in which a driving force of a MOS-FET is enhanced, and a method of manufacturing the device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device provided with a CMOS-FET circuit, comprising:
   a first element isolating film filling a trench provided around an NMOS forming region;
   a second element isolating film filling a trench provided around a PMOS forming region;
   a first insulating film provided on the first and second element isolating films;
   a second insulating film provided on the first insulating film;
   a tensile stress film provided on the second insulating film, penetrating the first and second insulating films, extending into the first element isolating film, and having a tensile stress, the tensile stress film having an end; and
   a compressive stress film provided on the second insulating film, penetrating the first and second insulating film, extending into the second element isolating film, and having a compressive stress, the compressive stress film having an end;
   wherein the end of the tensile stress film contacts the end of the compressive stress film above a region between the NMOS forming region and the PMOS forming region.

2. A semiconductor device provided with a CMOS-FET circuit, comprising:
   a first element isolating film filling a trench provided around an NMOS forming region;
   a second element isolating film filling a trench provided around a PMOS forming region;
   a first insulating film provided on the first and second element isolating films;
   a second insulating film provided on the first insulating film;
   a tensile stress film provided on the second insulating film, penetrating the first and second insulating film, extending into the first element isolating film, and having a tensile stress, the tensile stress film having an end; and
   a compressive stress film provided on the second insulating film, penetrating the first and second insulating film, extending into the second element isolating film, and having a compressive stress;
   wherein the end of the tensile stress film contacts the compressive stress film above the first element isolating film.

3. The semiconductor device according to claim 1, wherein the tensile stress film is a silicon nitride film formed by a reduced-pressure CVD process using dichlorosilane and ammonia.

4. The semiconductor device according to claim 2, wherein the tensile stress film is an alloy film containing at least one of titanium and tungsten.

5. The semiconductor device according to claim 1, wherein the compressive stress film is a silicon nitride film formed by a plasma CVD process using monosilane and ammonia.

6. The semiconductor device according to claim 1, wherein the tensile stress film surrounds an NMOS type active area.

7. The semiconductor device according to claim 6, wherein the tensile stress film surrounds the side surface and the upper surface of the active area.

8. The semiconductor device according to claim 1, wherein the compressive stress film surrounds a PMOS type active area.

9. The semiconductor device according to claim 8, wherein the compressive stress film surrounds the side surface and the upper surface of the active area.

10. A method of manufacturing a semiconductor device provided with a CMOS-FET circuit, comprising:
    forming a first element isolating film filling a trench around an NMOS forming region on a semiconductor substrate;
    forming a second element isolating film filling a trench around a PMOS forming region on the semiconductor substrate;
    forming a first insulating film on the first and second element isolating films;
    forming a second insulating film on the first insulating film;
    forming a first trench penetrating the first and second insulating films and extending into the first element isolating film;
    forming a tensile stress film in the first trench and on the second insulating film, the tensile stress film having an end;
    forming a second trench penetrating the first and second insulating films and extending into the second element isolating film; and
    forming a compressive stress film in the second trench and on the second insulating film, the compressive stress film having an end;
    wherein the end of the tensile stress film contacts the end of the compressive stress film above a region between the NMOS forming region and the PMOS forming region.

11. A method of manufacturing a semiconductor device provided with a CMOS-FET circuit, comprising:
    forming a first element isolating film filling a trench around an NMOS forming region on a semiconductor substrate;
    forming a second element isolating film filling a trench around a PMOS forming region on the semiconductor substrate;
    forming a first insulating film on the first and second element isolating films;
    forming a second insulating film on the first insulating film;
    forming a first trench penetrating the first and second insulating films and extending into the first element isolating film;
    forming a tensile stress film in the first trench and on the second insulating film, the tensile stress film having an end;
    forming a second trench penetrating the first and second the insulating films and extending into the second element isolating film; and
    forming a compressive stress film in the second trench and on the second insulating film;
    wherein the end of the tensile stress film contacts the compressive stress film above the first element isolating film.

12. The method according to claim 10, wherein the tensile stress film is further formed above the NMOS forming region.

13. The method according to claim 10, wherein the compressive stress film is further formed above the PMOS forming region.

14. The method according to claim 10, further comprising patterning a resist film on a part of the element isolating film around the NMOS forming region or the PMOS forming region, when the first trench is formed.

15. The method according to claim 14, wherein the resist film is patterned in parallel with a gate structure pattern on the semiconductor substrate.

16. The method according to claim 14, wherein the resist film is patterned perpendicular to a long dimension of a gate structure pattern on the semiconductor substrate.

17. The method according to claim 12, wherein a film thickness of the tensile stress film above the NMOS forming region is substantially equal to a short-side width of the first trench.

18. The method according to claim 13, wherein a film thickness of the compressive stress film above the PMOS forming region is substantially equal to a short-side width of the second trench.

19. The method according to claim 10, wherein the semiconductor substrate is a bulk Si substrate.

20. The method according to claim 10, wherein the semiconductor substrate is an SOI substrate.

* * * * *